United States Patent
Smallcombe et al.

[11] Patent Number: 5,847,564
[45] Date of Patent: Dec. 8, 1998

[54] SOLVENT SUPPRESSION METHOD FOR LC-NMR AND HIGH-RESOLUTION-NMR

[75] Inventors: Stephen H. Smallcombe, Redwood City; Steven L. Patt, Cupertino; Paul A. Keifer, Mountain View, all of Calif.

[73] Assignee: Varian Associates, Inc., Palo Alto, Calif.

[21] Appl. No.: 774,067

[22] Filed: Dec. 23, 1996

[51] Int. Cl.[6] .................................................. G01V 3/00
[52] U.S. Cl. .......................................... 324/307; 324/300
[58] Field of Search .................................. 324/300, 307, 324/309, 311, 314

[56] References Cited

U.S. PATENT DOCUMENTS

| | | | |
|---|---|---|---|
| 5,345,174 | 9/1994 | Kimmich et al. | 324/309 |
| 5,410,249 | 4/1995 | Van Yperen et al. | 324/309 |
| 5,544,652 | 8/1996 | Duyn | 324/309 |
| 5,677,628 | 10/1997 | Watanabe et al. | 324/309 |

OTHER PUBLICATIONS

Valk et al. Basic Principles of Nuclear Magnetic Resonance. Elsevier Science Publishing Company, Inc., New York, pp. 56–63, 1995.

*Primary Examiner*—Louis M. Arana
*Attorney, Agent, or Firm*—Edward Perkowitz

[57] ABSTRACT

Improved solvent suppression in NMR data is achieved using pulse sequences wherein each of a series of selective excitation pulses are followed by a magnetic gradient pulse and a delay, where the magnetic gradient pulse amplitudes monotonically decrease by a selected fraction of the preceeding gradient pulse. Decoupling a second nucleus during selective excitation pulses has been shown to be efficacious for suppression of organic solvents.

12 Claims, 6 Drawing Sheets

SOLVENT SUPPRESSION METHOD FOR LC-NMR AND HIGH-RESOLUTION-NMR

FIELD OF THE INVENTION

The invention is in the field of NMR phenomena and pertains particularly to suppression of solvent response in NMR data.

DISCUSSION OF THE INVENTION

Proton-detected high-performance liquid chromatography-NMR (LC-NMR), despite being known for over fifteen years, has not yet proven to be a widely accepted technique. One of the major impediments to the wider growth of the field is the difficulty of observing analyte resonances in the presence of the much larger resonances from the mobile phase. While this problem initially appears similar to the well-known problem of water suppression in normal liquid-phase biomolecular NMR samples, it is exacerbated by three additional characteristics: 1) in typical reversed-phase HPLC mobile phases there is more than one protonated solvent resonance (and all corresponding $C^{13}$ satellites), 2) the sample in the detector coil is typically flowing, and this replenishment of fresh spins complicates many solvent suppression techniques, such as presaturation, and 3) the solvent resonances change frequencies during the course of the solvent gradients (the chromatography "method") typically used during HPLC separations, thus presenting the spectroscopist with moving targets.

Recent developments in our laboratory address these solvent-suppression problems, and greatly improve the quality of spectra generated during both stopped-flow and on-flow LC-NMR. The combination of shaped rf pulses, pulsed-field gradients (PFG), and selective $C^{13}$ decoupling allow us to acquire high-quality spectra on both flowing and non-flowing column effluents, as demonstrated here using a typical $CH_3CN$:HOD mobile phase. The resulting solvent suppression schemes may also prove useful for conventional high-resolution NMR of samples in protonated solvents (e.g., 90:10 $H_2O$:$D_2O$) or with mixed solvents.

DETAILED DESCRIPTION OF THE INVENTION

It is known in prior art to employ a series of variable-tip-angle solvent-selective rf pulses, where each selective rf pulse is followed by a dephasing field gradient pulse. This technique is known as WET and is discussed by Ogg, et al, J. Mag. Res. B, v.104, p.1 (1994). repetition of the known simpler pulse-sequence-element CHESS [90° (selective)-gradient] (Haase, et al, Phys. Med. Biol., v.30, p.341 (1985)) can also be used to suppress the undesired solvent signals, but the four-pulse version of the WET sequence provides superior suppression. The repetitive pulse train in WET can be optimized to be insensitive to either T1 differences, B1-field inhomogeneities across the sample, or both, by varying the tip angles of the selective rf pulses. An early embodiment of the present invention focused on the B1-inhomogeneity optimized version of four selective pulses, which uses the following sequence (where G1–G4 are pulsed-field gradients): 98.2° (selective)-G1-80.0° (selective)-G2-75.0° (selective)-G3-152.2° (selective)-G4-90° (nonselective)-Acquire. In another embodiment of the invention the T1-and-B1-optimized four-pulse WET sequence is used and typically generates small but inverted solvent resonances, which can then be further reduced by the inclusion of a short delay (0.5–2 msec) following the final field-gradient pulse (G4). This yields the sequence: 81.4° (selective)-G1-101.4° (selective)-G2-69.3° (selective)-G3-161.0° (selective)-G4-dz-90° (nonselective)-Acquire. The dz delay is empirically optimized to minimize the amplitude of the small but inverted solvent signals, much like the delay following the 180° pulse in WEFT. See Patt, et al, J. Chem. Phys., 56, 3182–3184 (1972). While both the B1 and the T1-and-B1 WET sequences work very well, the T1-and-B1 WET sequence is the preferred embodiment of the invention due to its slightly better quality of solvent suppression.

It was recognized in prior art that the solvent-signal echos generated during repeated CHESS pulses in in vivo applications could be avoided by doubling the gradient strength of each subsequent field-gradient pulse (Moonen, et al, J.Mag. Res.,v.88, p.28 (1990)). In the present invention the gradient echoes were more effectively minimized by halving the intensity of each subsequent gradient pulse, yielding G2=½*G1, G3=¼*G1, and G4=⅛*G1, where G1 was typically a Z1-axis gradient having an amplitude of 32 G/cm and a duration of 2 msec. This not only places the strongest field-gradient pulse immediately after the selective pulse which generates the largest amount of transverse magnetization, but also places any eddy currents induced by the strongest gradient pulse furthest from the acquisition.

The invention can also be generalized by application of the shifted laminar pulse (SLP) technique. See Patt, J. Mag. Res. vol.95, p.94, (1991). Using SLP, a pulse can be delivered off-resonance, yet still retain phase-coherence with the transmitter and receiver. In addition, the SLP technique can generate pulses which act simultaneously at two (or more) off-resonance frequencies, all without altering the transmitter frequency itself. This can be used to deal with multiple protonated resonances in LC-NMR; we simply modify the WET technique to use selective SLP pulses which target the various solvent frequencies we desire to suppress. While previous LC-NMR efforts often used fully deuterated solvents to minimize solvent background, this is expensive and not generally useful, and we find that WET is perfectly capable of generating good solvent suppression when using $CH_3CN$:HOD mobile phases. (While some deuterated resonance is desirable for establishing a lock for long-term acquisitions, in practice it is not required for short-term or solvent-gradient experiments, which allows a user to use fully protonated binary or ternary mobile phases.) The size and bandwidth of the residual solvent resonance which can be tolerated dictates the duration of the selective SLP pulses; in practice we use a transmitter power which results in a 20 msec 90° pulse. The amplitude of each of the four shaped SLP pulses is scaled to generate the required tip angles for WET. Each solvent frequency added to the SLP pulse requires additional peak rf power to maintain proper tip angles (e.g., two frequencies requires an increase in power of 6 db). A principal advantage of the B1 and the T1-and-B1-insensitive WET techniques, however, is their tolerance of miscalibrated pulse powers. In practice, the transmitter power is set once for a given probe, and then requires no further adjustment unless the selective pulse duration is modified to alter frequency selectivity.

In principle, many different rf shapes could be used for the selective pulses. One would like the selective pulse to be as time efficient as possible, since time spent preparing the spins is effectively time lost from either a longer acquisition time or increased signal averaging. This is especially critical during a flowing LC-NMR experiment, where fresh polarized spins are continually replenishing the sample cell (which shortens the effective T1) and the signals of interest are continually being flushed from the cell. In the present invention, it is preferred to employ SEDUCE pulses (McCoy, et al, J. Am. Chem Soc., vol.114, p.2108(1992)) which are shorter in time than other pulses having a similar frequency response.

While multiple-resonance techniques, such as the present invention and the prior art presaturation scheme suppressed the $CH_3CN$ and HOD resonances quite well, the next largest mobile-phase resonances were the $C^{13}$ satellites of the $CH_3CN$ ($1J1H-C^{13}$=125 Hz). See FIGS. 3a and 3b as examples. These satellites are largely unsuppressed when using a 20 msec SEDUCE pulse centered on the central $12CH_3CN$ resonance. Instead of using a broader excitation, e.g., a shorter SEDUCE pulse and attempting to suppress this entire 125 Hz region, including potential peaks of interest, low-power $C^{13}$ decoupling at the $C^{13}$ frequency of $CH_3CN$ (+1.6 ppm) was introduced during the 20 msec saturation period (CW decoupling was used here, but WALTZ, GARP, and MPF7 modulation schemes known to prior art have all been shown to produce acceptable results). This collapses the $C^{13}$ satellites into the $12CH_3CN$ resonance (the $C^{13}$ isotope shift can be ignored) where they can be suppressed with the same narrowband (20 Hz) excitation used to suppress the $12CH_3CN$ protons. Thus, a component (or molecular) selective suppression is obtained instead of a wider spectral band of suppression. An example of this is to be found at FIG. 3c where the peak at 1.8 ppm is evident using the present invention, in contrast to the spectra of FIGS. 3a and 3b where this peak is hidden by a $C^{13}$ satellite of the acetonitrile peak. A general expression of the present technique is illustrated schematically in the pulse sequence of FIG. 1b.

Figure 1A:
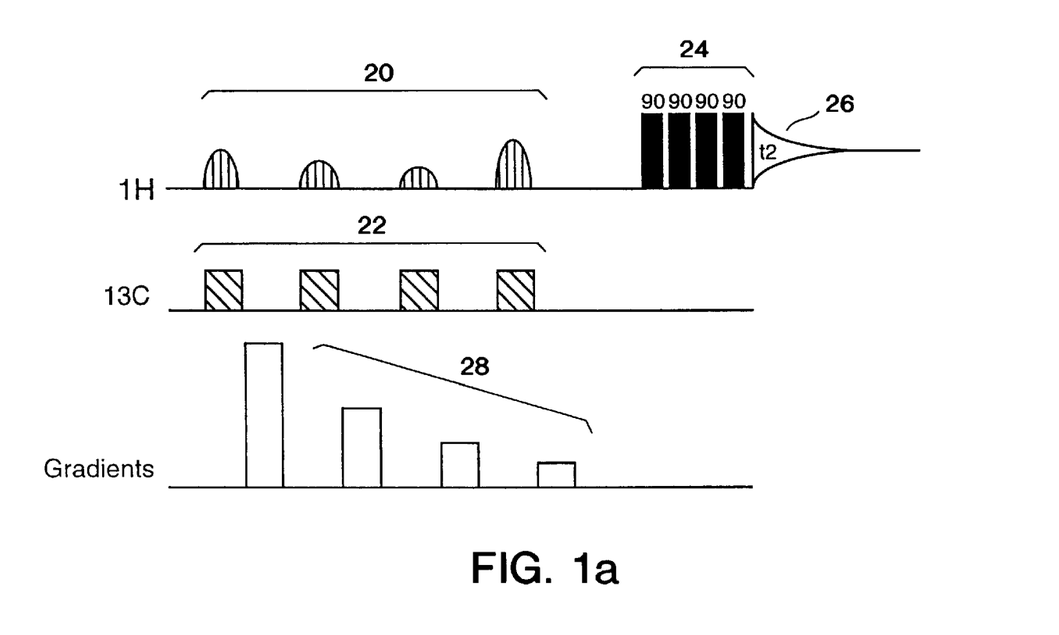
FIG. 1 represents a pulse sequence of the invention as applied to 1D LC-NMR.

The preferred form of sequence used for 1D LC-NMR is shown in FIG. 1a. The RF selective pulses of a four pulse sequence 20 and 22 are followed by a read pulse 24, after which the waveform of the free induction decay 26 is acquired. The RF pulses 20 and 22 are interspersed with gradient pulses 28 as above described. As shown, a spatially-selective composite read pulse (90x, 90y, 90-x, 90-y) may be used in place of a simple final 90° pulse if desired. The use of this composite pulse typically produces a better baseline with a narrower base for the residual solvent line.

Figure 1B:
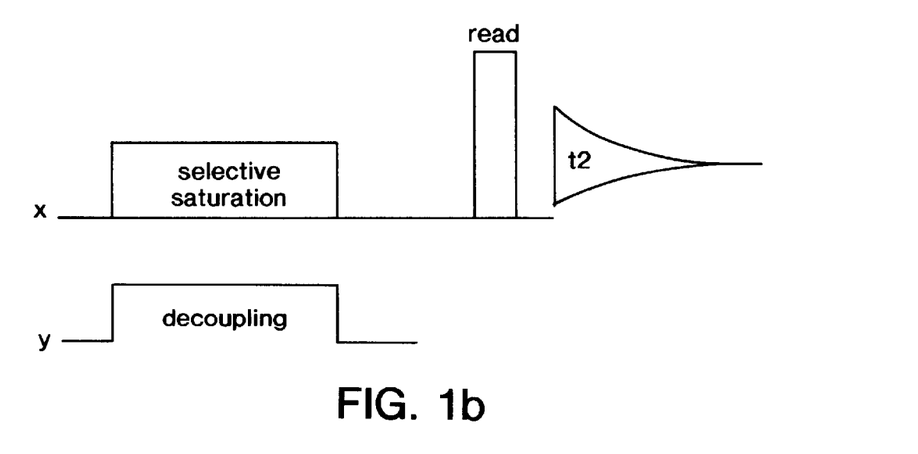

FIG. 1a is a special case of FIG. 1b wherein saturation is obtained by the combination of the a series of selective RF pulses 20 and accompanying gradient pulses 28. The decoupling is obtained from the time concurrent series of decoupling pulses 22. Selective saturation of the nuclear spins directed to one nuclear species of the heteronuclear molecule and concurrent decoupling directed to another, coupled nuclear species of that molecule remains the key conceptual basis of the technique.

Figure 2A:
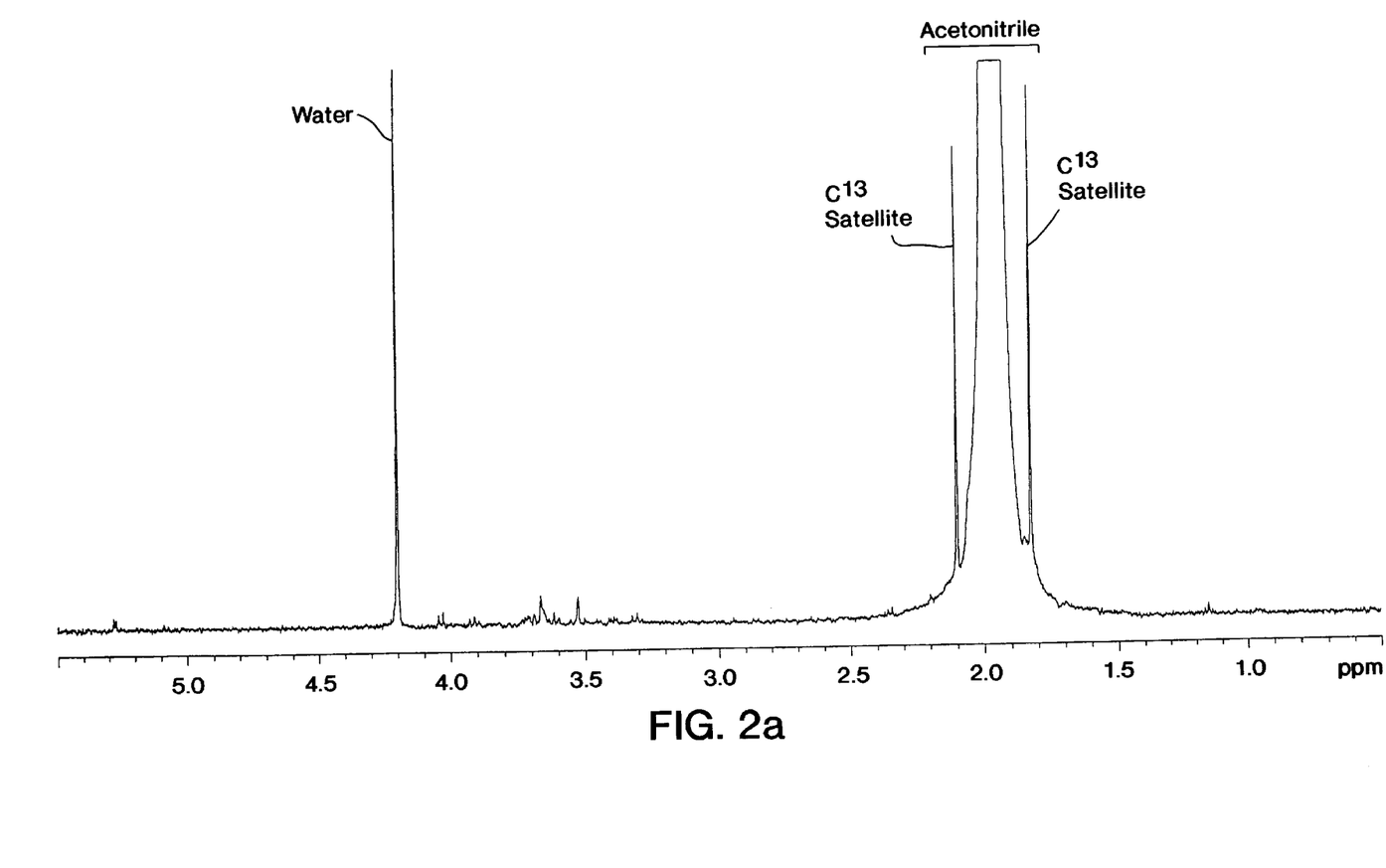
FIG. 2a is a simple prior art spectrum of a sample without solvent suppression.
Figure 2B:
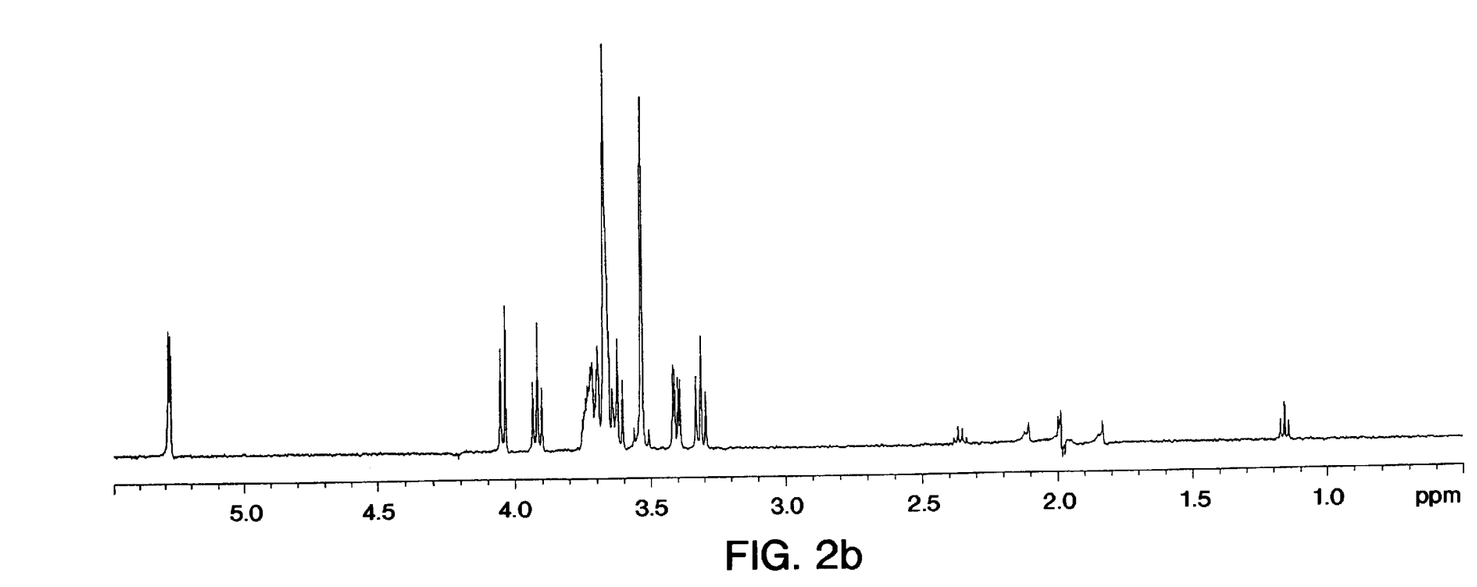
FIG. 2b shows the spectrum from the sample of FIG. 1 using the present invention.

An example of the level of solvent suppression achieved is shown in FIG. 2. Note particularly the homonuclear solvent suppression ("water" of FIG. 2a) and combined heteronuclear and homonuclear suppression ("acetonitrile" of FIG. 2a) by comparison with respective spectral regions of FIG. 2b.

Figure 3A:
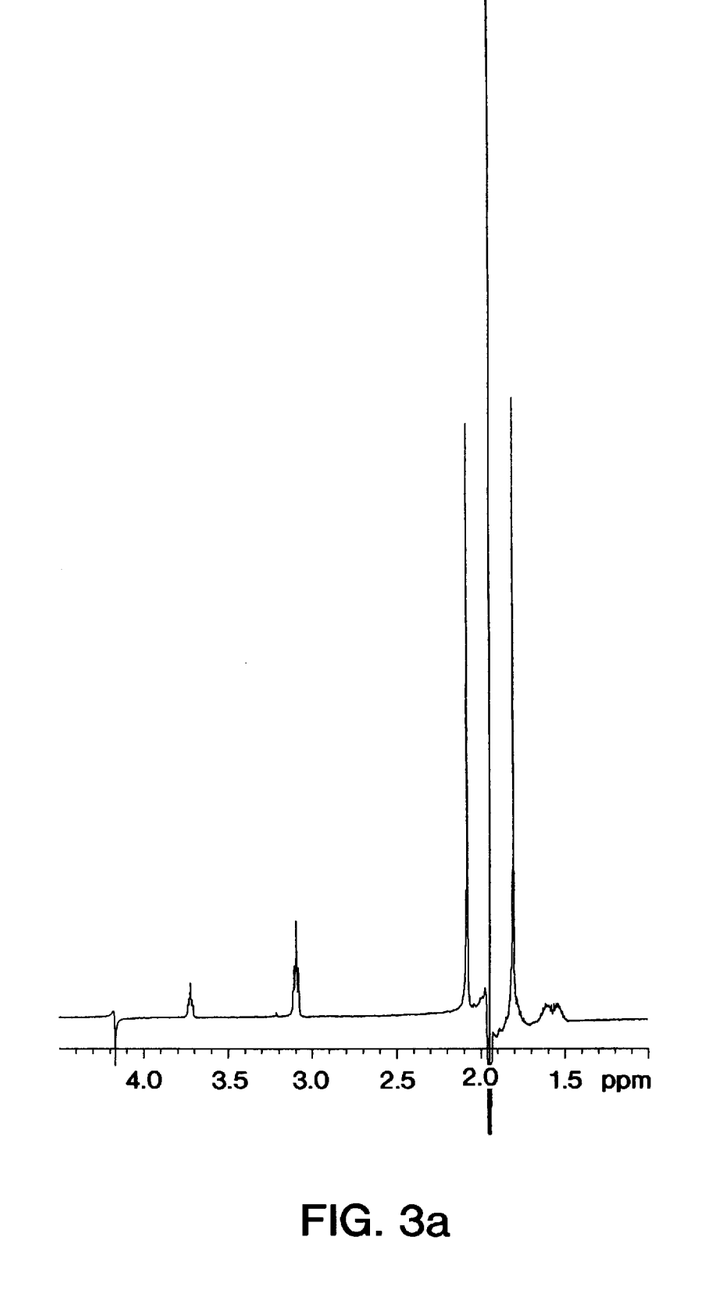
FIG. 3a shows a prior art spectrum employing presaturation
Figure 3B:
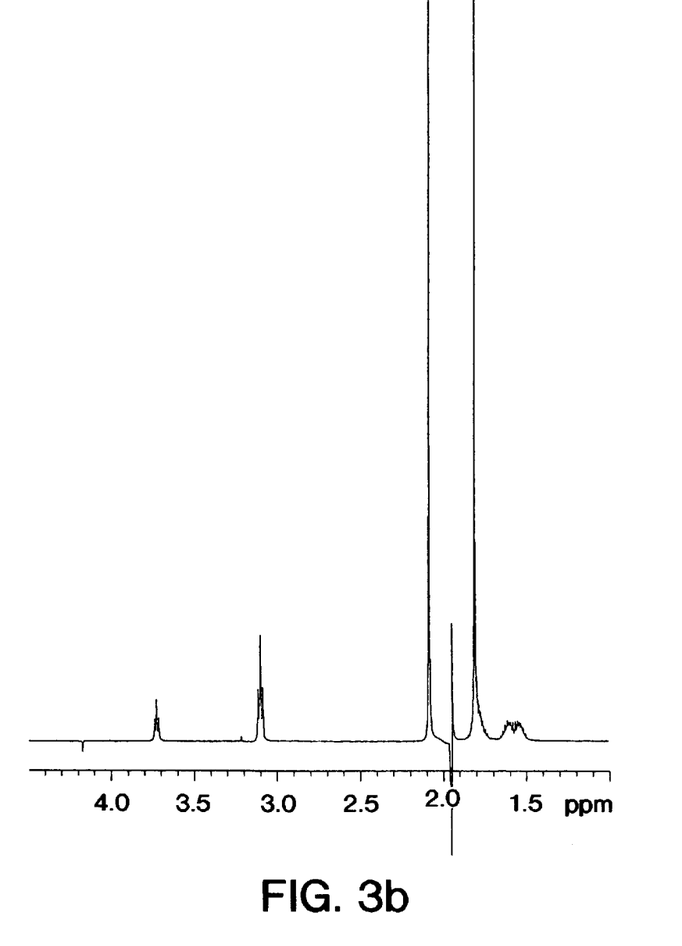
FIG. 3b is a spectrum of the sample of FIG. 3a using the invention without $C^{13}$ decoupling.
Figure 3C:
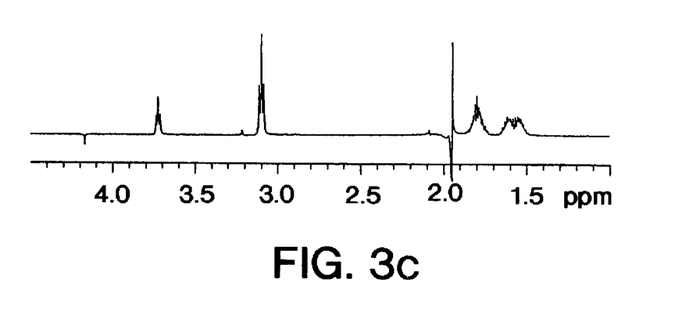
FIG. 3c is a spectrum of the sample of FIG. 3a using the invention with $C^{13}$ decoupling.

A comparison of WET to presaturation, as demonstrated on a flowing sample of arginine (in 50:50 $CH_3CN:D_2O$), is shown in FIG. 3. The bottom spectrum (FIG. 3a) was obtained with conventional presaturation. Presaturation (without $C^{13}$ decoupling) clearly offers no significant suppression of the $C^{13}$ satellites of the acetonitrile, other than an approximately 20% loss of satellite intensity due to the general nonselectivity of the low-power square presaturation pulse; a loss which will affect all other resonances located near the satellites. The middle spectrum (FIG. 3b) was obtained using the WET sequence but with the selective $C^{13}$ decoupling turned off; not only is the suppression of the center resonance of acetonitrile much better, (especially for flowing samples like this), but the $C^{13}$ satellites are actually at their full intensity due to the higher selectivity of the 22.4 msec SEDUCE pulses. (FIG. 3b is illustrative of the utility of the invention applied to a single selected spin system.) The top spectrum (FIG. 3c) was obtained using the final WET sequence with selective $C^{13}$ decoupling; the $C^{13}$ satellites have been suppressed over 200-fold without disturbing other coincident resonances—as evidenced by the now clearly visible arginine resonance at 1.8 ppm. The superior HOD suppression of WET can also be observed in FIGS. 3b and 3c. $C^{13}$ decoupling with presaturation would yield similar results although with poorer suppression and the above mentioned intensity loss for peaks near the solvent.

As can be seen in FIGS. 2 and 3, WET solvent-suppression spectra are characterized by flat baselines, uniform excitation, and simple linear phase corrections. The suppression is robust and requires no readjustments of rf powers, rf phases, excitation frequencies, or probe tuning to accomodate normal variations in sample temperatures, solvent composition, or sample concentration. The technique provides solvent-resonance suppression factors in excess of 10000 in a single scan, and can deal with multiple non-deuterated solvent mixtures. The suppression requires only 50–100 msec, in contrast to conventional presaturation which typically takes 1–2 seconds. While conventional presaturation could irradiate multiple solvent resonances in a static sample, it is an equilibrium technique and provides only poor solvent suppression when the sample is flowing through the probe as in LC-NMR. (With typical HPLC flow rates [0.5–1.0 ml/min.] and typical LC-NMR probe volumes [i.e. 60 µL] the probe's active volume is potentially replaced every 3–7 seconds. The probe's external solvent-inlet line is located within the magnet's BO field enough to allow pre-polarization, but it may not be surrounded by any suitable B1 coil which could "pre-"presaturate the solvent resonances.) Another advantage of using WET is its ability to excite different bandwidths at its different frequencies (which is useful if the solvent resonances are dissimilar in intensity, or if the linewidths are radically different), and to do it all with only a single transmitter, allowing even $1H-C^{13}$ HMQC LC-NMR to be easily run on only a standard two-channel spectrometer.

This modified WET technique can now be adapted for use with solvent gradients. In an acetonitrile:water solvent gradient, the relative positions of the acetonitrile and water resonances change as a function of the mobile-phase composition (and sample temperature). In practice, we find that spectral qualities are improved if the acetonitrile resonance is kept at a constant chemical shift (along with all the other sample resonances), and the frequency of the water is allowed to change. This can be easily accomplished "on-the-fly" during the solvent gradient by resetting the transmitter to the acetonitrile position (1.95 ppm) for each new spectrum (the 2H lock [on the D20] merely serves as a traditional long-term field-frequency lock for long-term stopped-flow acquisitions). This process is easily automated with NMR software (18) which can take a small-tip-angle single-pulse "scout" scan, locate the acetonitrile peak (which will be somewhere near 1.95 ppm), reset the transmitter to that frequency, locate the next largest peak (which typically will be the HOD), and then calculate a shaped pulse which will excite both the acetonitrile and the water resonances. The results of this "scout" scan are then used to adjust solvent suppression conditions for the next "real" time-averaged proton spectrum. (A "single-shot scout" scan was actually used to automatically set up the solvent suppression for all 1D and 2D LC-NMR spectra shown—FIGS. 2, 3, 5, 6, and 7).

If the scout scans and the time-averaged scans are interleaved, the solvent positions can be fully and automatically tracked during the course of the solvent gradient. This eliminates the need to first run a preliminary "blank" spectrum on the solvent-gradient to memorize solvent positions before injecting the real sample and rerunning the solvent gradient; this affords considerable time savings. In addition, if the acetonitrile resonance is always reset in this way to a constant chemical shift, regardless of the frequency of the $^2$H lock (which is moving due to the solvent gradient), not only does this result in properly referenced spectra, but it allows the user to take advantage of standard digital-signal-processing techniques and solvent-deconvolution routines. The one-shot scout spectrum can also be used to automatically adapt solvent suppression to a new solvent mixture in stopped-flow 1D or 2D spectra. Again, all of the advantages of WET itself are valid regardless of whether the solvent is flowing, static, isocratic, gradient, or even if it is being flushed in from loop collections; the solvent suppression is equally good in all cases.

Figure 4:
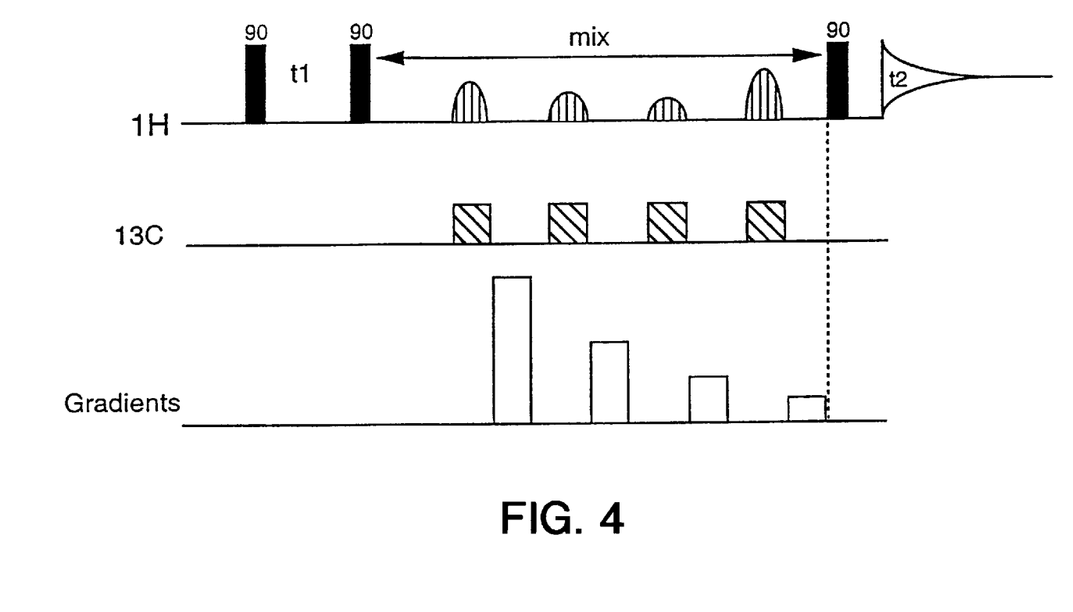
FIG. 4 shows a modification of a 2D (NOESY) pulse sequence to incorporate the present invention.

Turning now to FIG. 4, there is shown an example of the utility of the present invention in modification of other data acquisition techniques. While the above discussion has been in terms of simple 1D spectra using an NMR probe designed for on-flow or stopped flow NMR in the context of LC-NMRexperiments, the invention applies and has been used for a wide range of 1D or n-dimensional NMR experiments as a general spectral component suppression element. For example, the elements comprising this invention can be incorporated into the well known NOESY pulse sequence (representative of multidimensional NMR experiments) as shown in FIG. 4. The invention can, in general, be incorporated into the preparation period or relaxation delay of virtually any NMR experiment typically applied to liquid state NMR.

Conclusion

The present invention implements a magnetic resonance pulse sequence which is more frequency selective than previously obtained in the prior art. The present invention also is more time efficient than the prior art because less time is required for preparation of the spins, as for example by presaturation methods of prior art, and thus more time is available for data acquisition. In a dynamic process, such as chemical exchange situation or the observation of a flowing liquid, this feature is of paramount importance. Finally, a very high level of solvent suppression is achieved for each transient waveform observed and this is achieved without time intensive techniques such as phase cycling.

The present work demonstrates that LC-NMR now has a generic tool available which can generate high-quality spectra with a minimum disturbance of nearby resonances. WET LC-NMR is very effective in obtaining 1D spectra of both flowing and nonflowing samples, as well as stopped-flow 2D spectra. It has proven to be a quite robust and effective tool for LC-NMR, and it is expected to prove useful for solvent suppression problems in conventional liquids NMR spectroscopy as well using either flow or static probes.

Although the present invention has been described in detail with reference to the embodiments above presented, it is not intended that the invention be restricted to such embodiments. It will be apparent to those skilled in the art that various departures from the foregoing description may be made without departing from the scope or spirit of the invention. Therefore it is intended that the invention be limited only by the following claims.

What is claimed is:

1. A pulse sequence for excitation of magnetic resonance phenomena in liquid samples comprising I and S nuclei, while suppressing solvent magnetic resonance phenomena therein, comprising
   a) selectively irradiating I nuclei of said sample with a plurality of spaced selective RF pulses to excite magnetic resonance thereof,
   b) selectively irradiating S nuclei of said sample with a plurality of spaced selective RF pulses concurrently with step a), to excite magnetic resonance thereof,
   c) applying to said sample a plurality of magnetic field gradient pulses, each said gradient pulse following corresponding irradiation pulses of S and I nuclei, each said gradient pulse having a duration less than the interval between consecutive I and S irradiation pulses, the first gradient pulse having a selected amplitude and each successive gradient pulse having an amplitude of a selected fraction of the preceding gradient pulse,
   d) applying a read pulse to said I spin system and acquiring the time domain waveform of the de-excitation of said I spin system.

2. The pulse sequence of claim 1 wherein said selected fraction is no more than one half.

3. The pulse sequence of claim 1 wherein said gradient pulse includes a delay interval at the termination of said gradient pulse.

4. The pulse sequence of claim 3 wherein said read pulse is spatially selective.

5. The pulse sequence of claim 3 wherein said I nuclei exhibit a plurality of chemical shifts and said selective RF pulses are modulated in phase to excite multiple resonances of said I nuclei.

6. The pulse sequence of claim 3 wherein said I nuclei exhibit a plurality of chemical shifts and said selective RF pulses are modulated in amplitude to excite multiple resonances of said I nuclei.

7. The pulse sequence of claim 3 wherein said I nuclei exhibit a plurality of chemical shifts and said selective RF pulses are modulated in phase and amplitude to excite multiple resonances of said I nuclei.

8. A pulse sequence for excitation of magnetic resonance phenomena in liquid samples comprising selected nuclei, while suppressing solvent magnetic resonance phenomena therein, comprising
   a) selectively irradiating said selected nuclei of said sample with a plurality of spaced selective RF pulses to excite magnetic resonance thereof, b) applying to said sample a plurality of magnetic field gradient pulses, each said gradient pulse following corresponding irradiation pulses of said selected nuclei, each said gradient pulse having a duration less than the interval between consecutive irradiation pulses, the first gradient pulse having a selected amplitude and each successive gradient pulse having a monotonically decreasing amplitude of a selected fraction of the preceding gradient pulse, c) applying a read pulse to the spin system of said selected nuclei and acquiring the time domain waveform of the de-excitation of said spin system.

9. The pulse sequence of claim 8 wherein said selected fraction is no more than one half.

10. The pulse sequence of claim 8 wherein said gradient pulse includes a delay interval at the termination of said gradient pulse.

11. The pulse sequence of claim 8 wherein said read pulse is spatially selective.

12. A method for supression of magnetic resonance phenomena for selected spectral components resulting from NMR excitation of a liquid sample comprising heteronuclear molecules comprising first nuclear species and second nuclear species coupled thereto, said method comprising the steps of, a) exciting to saturation said first nuclear species by appplying to said sample a plurality of selective RF pulses spaced in time and applying a like plurality of magnetic gradient pulses, each of said magnetic gradient pulses offset in time alignment with a corresponding one of said plurality of RF selective pulses, b) concurrently with step a), applying decoupling radiation to said second nuclear species and, c) applying a read pulse to said first nuclear species and acquiring a waveform representative of the de-excitation thereof.

* * * * *